United States Patent [19]

Harnden, Jr. et al.

[11] 4,438,396

[45] Mar. 20, 1984

[54] LOW COST VOLT/AMPERE METER WITH LIQUID CRYSTAL DISPLAY

[75] Inventors: John D. Harnden, Jr.; William P. Kornrumpf, both of Schenectady, N.Y.

[73] Assignee: General Electric Company, Schenectady, N.Y.

[21] Appl. No.: 286,491

[22] Filed: Jul. 24, 1981

[51] Int. Cl.³ .................... G01R 1/22; G01R 15/08
[52] U.S. Cl. .................... 324/127; 324/96; 324/115; 324/122
[58] Field of Search .............. 324/127, 96, 115, 122

[56] References Cited

U.S. PATENT DOCUMENTS

| | | | |
|---|---|---|---|
| 2,146,555 | 2/1939 | Arey | 324/127 |
| 2,905,899 | 9/1959 | Miller et al. | 324/127 |
| 4,060,801 | 11/1977 | Stein et al. | 340/324 R |
| 4,212,011 | 7/1980 | Waldron | 340/784 |
| 4,301,407 | 11/1981 | Koslar | 324/96 |

Primary Examiner—Ernest F. Karlsen
Attorney, Agent, or Firm—Marvin Snyder; James C. Davis, Jr.

[57] ABSTRACT

A low cost volt/ampere meter for consumer use employs a single liquid crystal bargraph display and a simple voltage divider network to display both line voltages and appliance currents encountered in a residential environment. The instrument employs standard line voltage prongs on one end and a socket for accepting standard line voltage prongs on the other end. A range switch connects the instrument to read either voltage across the meter prongs or current through the prongs. When the prongs are inserted into a duplex receptacle and an appliance is plugged into the meter socket, current drawn by the appliance will be displayed on the bargraph when the range switch is selected to read amperes.

23 Claims, 2 Drawing Figures

LOW COST VOLT/AMPERE METER WITH LIQUID CRYSTAL DISPLAY

RELATED APPLICATION

This invention is related to Harnden and Kornrumpf application Ser. No. (Docket RD-10,912) filed concurrently herewith and assigned to the instant assignee.

INTRODUCTION

This invention relates to inexpensive voltage and current measuring equipment, and more particularly to a low cost plug-in type instrument for providing a digital indication of measured AC voltage and current magnitude.

With ever-increasing energy costs and the possibility of more frequent power blackouts and brownouts due to inadequate generating capacity, consumers are becoming more interested in knowing how much voltage is being supplied to their residences and how much current is being drawn by their appliances. This gives rise to need for a simple indicating volt/ampere meter which is low in cost, safe and easy to use, and easy to read. Such meter should preferably employ two voltage ranges, one with full scale reading on the order of 115 to 130 volts and a second range with full scale reading at the 240 volt level. Two ampere ranges would also be desirable, one having a full scale reading of 5 amperes for small appliances and a second having a full scale reading of 30 amperes for larger appliances. The present invention is directed to an instrument of this type.

The instrument of the instant invention has the advantage of rugged construction since no mechanical meter movements are employed. The instrument can be small and lightweight due, in part, to the compact nature of the display. This display is preferably of the liquid crystal bargraph display type, and can be manufactured in a way that reduces its susceptibility to damage by the consumer in normal operation. Thus, for example, if the range switch is positioned to measure current and the consumer really intended to measure voltage, the system will not malfunction and burn out.

Designers of typical volt/ammeters for the home market have, in the past, employed either D'Arsonval meter movements to measure magnitude of voltage and current or, alternatively, have used a digital circuit approach requiring an analog-to-digital converter circuit and often sample-and-hold circuits as well. In the typical digital circuit approach, batteries supply the logic power needed to operate the analog-to-digital and sample-and-hold circuits. In the case of a D'Arsonval meter movement, a current transformer is employed in which the secondary winding voltage is rectified with an instrument rectifier of the selenium or copper oxide type. The current indications from such circuitry are quite nonlinear due to the low voltages available from the current transformer output rectifiers normally used in the circuit. The present invention, therefore, concerns an instrument which provides a digital indication of voltage and current magnitude without requiring a separate power supply, and which is capable of fulfilling the aforementioned need for a simple indicating volt/ampere meter which is low in cost, safe and easy to use, and easy to read.

Accordingly, one object of the invention is to provide a simple, low cost, volt/ampere meter.

Another object is to provide a digital volt/ampere meter requiring no separate power supply.

Another object is to provide a plug-in type volt/ampere meter which is safe and easy to use.

BRIEF DESCRIPTION OF THE DRAWING

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

Briefly, in accordance with a preferred embodiment of the invention, a volt/ampere meter comprises a flux coupling means, a plurality of conductors for carrying alternating current to an electrical appliance, one of the conductors establishing a conduction path through the flux coupling means so as to form a primary winding for the flux coupling means. A secondary winding is wound on the flux coupling means. A first plurality of prongs are coupled, respectively, to one end of each one of the plurality of conductors, respectively, and are adapted to be inserted into a power receptacle. A socket adapted to receive a second plurality of prongs is provided, such that each respective conductor electrically couples each prong of the first plurality, respectively, to each prong of the second plurality, respectively. Liquid crystal display means comprising a plurality of display segments are provided, along with switching means adapted to be coupled to a selected one of the secondary winding means and the conductor passing through the center of the core. Circuit means are provided for coupling each segment of the liquid crystal display means to the switching means. The circuit means energizes selected segments of the liquid crystal display means in accordance with voltage amplitude on the switching means.

DESCRIPTION OF PREFERRED EMBODIMENTS

Figure 1:
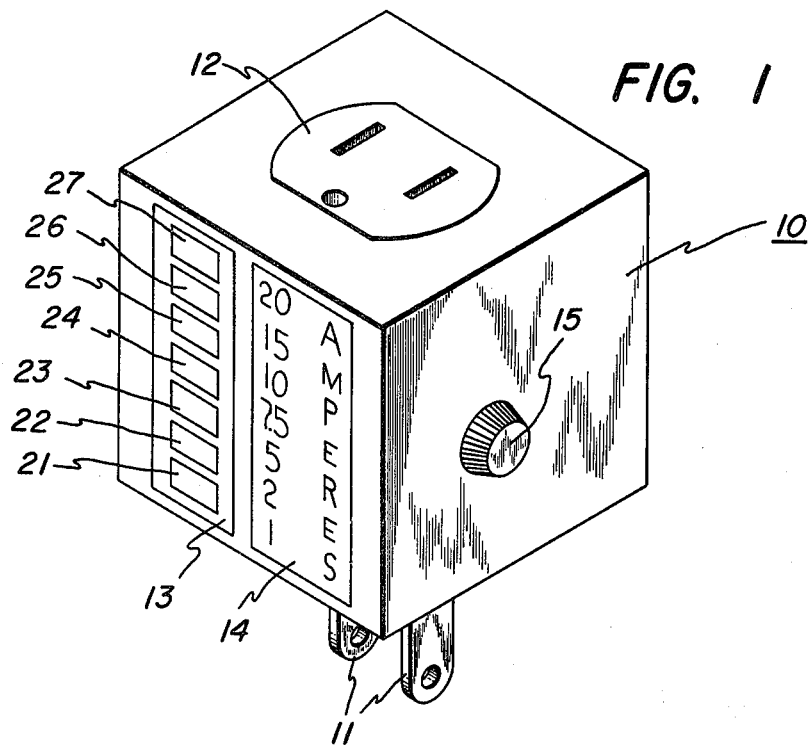
FIG. 1 is a perspective view of one embodiment of the invention as contained within a housing, showing the liquid crystal bargraph display alongside a typical ampere scale.

FIG. 1 illustrates one embodiment of the invention as it can be packaged for sale to individual consumers. The volt/ampere meter 10 includes a pair of prongs 11 for insertion into an AC receptacle, and a corresponding socket 12 adapted to receive an electrical appliance power cord plug. The meter includes a bargraph-type liquid crystal display 13 including a plurality of bargraph segments 21–27, and a scale 14 identifying the parameter being measured and indicating the amplitude of that parameter. A manually-operable knob 15 controls a selector switch which may be used to display either amperes or volts, and within a selected one of a plurality of ranges.

While electrically establishing what parameter is to be measured, and with what scale factor, knob 15 also determines what parameter and scale are presented on display 14 so that the display corresponds to the parameter being measured and with the proper scale for the amplitude of that parameter. Display 14 preferably constitutes a printed scale and parameter identification on separate sectors, respectively, of the curved surface of a cylinder, such that only one scale and its associated parameter are visible to the user at any time. The cylinder is mechanically coupled to knob 15 in any convenient and well-known manner so as to be rotatable about its axis in accordance with the selected position of knob 15. It will be recognized, of course, that other elongated solid (or hollow) geometric bodies may be employed in display 14 instead of a cylinder.

Figure 2:
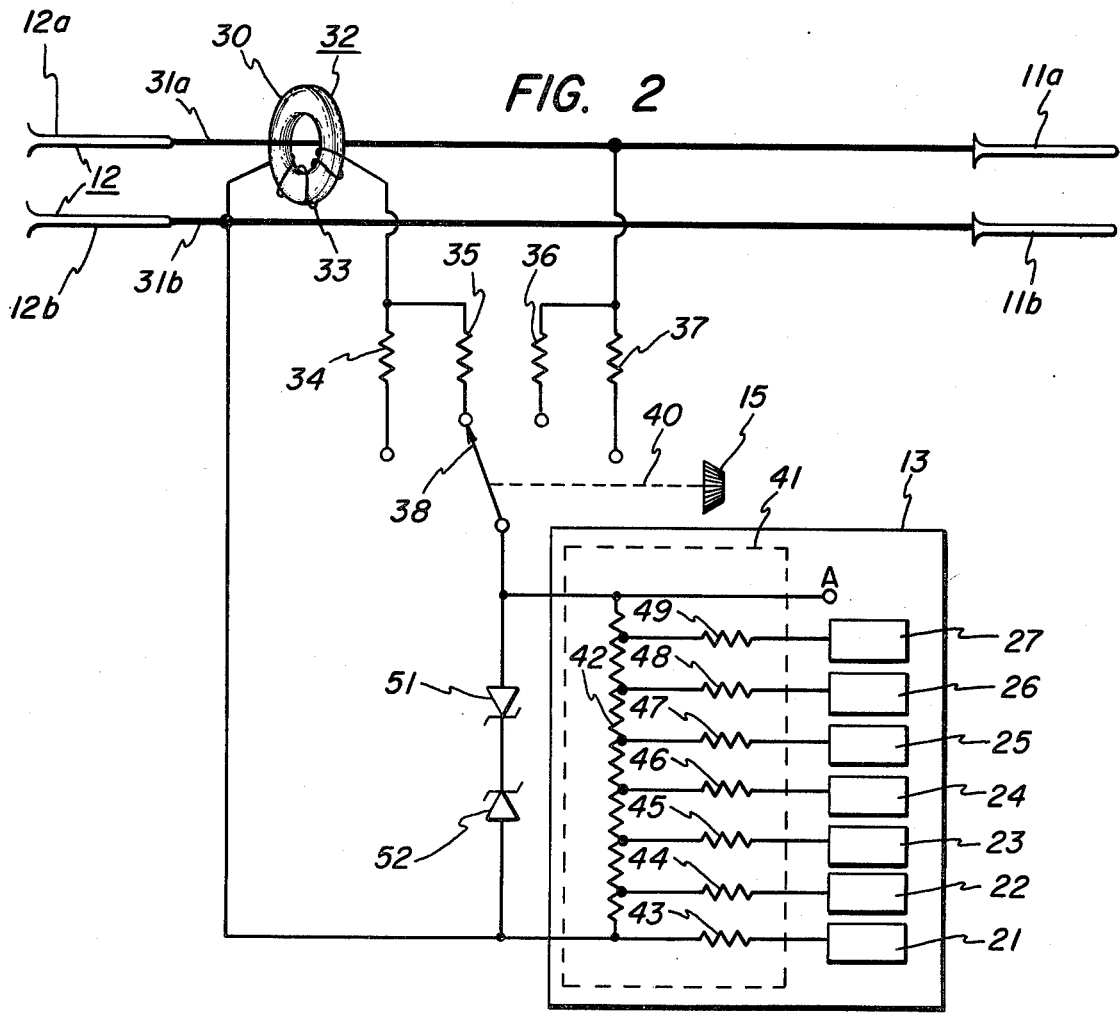
FIG. 2 is a schematic drawing of the circuit employed in the invention.

FIG. 2 illustrates the circuitry contained in device 10 of FIG. 1. Prongs 11a and 11b, respectively, and each one of receptacles 12a and 12b, respectively, of socket 12, are connected by a pair of conductors 31a and 31b, respectively. Conductor 31a passes through the center of a flux coupling means in the form of a magnetic core 30, thereby establishing a conduction path through the flux coupling means. Conductor 31a and core 30, along with a secondary winding 33 wound on core 30, form a current transformer 32. Conductor 31b is connected to one end of winding 33.

Secondary winding 33 may be connected through one of limiting resistors 34 and 35, and a range selector switch 38 which is actuated by knob 15 through a shaft 40, to a resistive divider network 41. Alternatively, the voltage across conductors 31a and 31b may be measured by turning selector switch 38 to either of limiting resistors 36 and 37, both of which are connected to conductor 31a, so as to connect conductor 31a in series with a limiting resistor 36 or 37 to resistive divider network 41. Network 41 comprises a parallel-connected resistor 42 having a plurality of tapped locations thereon coupled through resistors 43-49, respectively, to bargraph-type segments 21-27, respectively, of liquid crystal display 13. Display 13 may, for example, be fabricated according to the teachings of W. K. Waldron U.S. Pat. No. 4,212,011 issued July 8, 1980 and assigned to the instant assignee. One end of tapped resistor 42 is coupled through resistor 43 to bargraph-type segment 21 of liquid crystal display 13 while the other end of tapped resistor 42 is coupled to anode terminal A of liquid crystal display 13. Since the liquid crystal display segments exhibit very high input impedance, the impedance of the resistive network comprising tapped resistor 42 and coupling resistors 43-49 can be made high enough to avoid heavily loading current transformer 32 when current measurements are being made by the device. This allows use of a very large number of turns on secondary winding 33, and the wire employed in such winding can be of very fine diameter. Moreover, by using well-known deposited thin film techniques for fabricating a resistor network concurrently with the liquid crystal display, tapped resistor 42 and coupling resistors 43-49 can be fabricated completely in thin film form, thereby eliminating all but two of the interconnections to bargraph liquid crystal display 13.

When range selector switch 38 is connected to resistors 34 or 35, current passing through conductor 31a is measured. If range selector switch 38 is connected to resistor 34, a low full scale current range, such as 5 amperes, for example, may be selected. As current passes between prongs 11 and socket 12 in the instrument, it couples the current transformer core 30 and produces a voltage on secondary winding 33 of current transformer 32. This voltage is then divided by the liquid crystal display resistor network 41 in the manner described in the aforementioned Harnden and Kornrumpf application Ser. No. (Docket RD-10,912) filed concurrently herewith. Thus at very low current, only the lowermost bargraph display element 21 will change color. As current in primary winding 31a of transformer 32 increases, additional bargraph display elements change color in consecutive order, starting from element 22 and moving upward. When all of elements 21-27 have changed color, the bargraph display indicates maximum current.

By moving range selector switch 38 to the next position so as to connect limiting resistor 35 in series with resistive network 41, and because resistor 35 is of a larger ohmic value than resistor 34, the range of the instrument is changed to a higher full scale value, preferably on the order of 30 amperes. It will be appreciated, by those skilled in the art, that additional limiting resistors connected to winding 33 may be employed in order to provide the instrument with additional current ranges.

By moving range selector switch 38 to connect to resistor 36 so that the voltage measuring function is enabled, the voltage between prongs 11a and 11b is measured by the liquid crystal display with resistor 36 establishing the full scale voltage reading. Again, the bargraph display changes color from its lowermost to its uppermost element, consecutively, as voltage rises from zero to a maximum value. A different full scale voltage reading is selected if switch 38 is connected to resistor 37, however. For example, resistor 37 might be of a higher ohmic value than resistor 36, so as to allow measurement of 240 volt circuits. Additional limiting resistors connected to conductor 31a may, if desired, be employed in order to provide the instrument with additional voltage ranges.

Whenever one of resistors 34, 35, 36 and 37 is selected by switch 38, the appropriate scale, being mechanically coupled to switch 38, appears alongside liquid crystal bargraph display 13. Therefore, with switch 38 connected to resistor 34, the low current scale (e.g., full scale deflection of 5 amperes) is displayed in the printed area alongside the bargraph display. As switch 38 is rotated, different scale indications for the appropriate parameter (i.e., voltage or current) are displayed alongside liquid crystal bargraph display 13.

A pair of series-opposed Zener diodes 51 and 52 are connected across resistor 42 for the purpose of limiting the maximum voltage impressed on liquid crystal display 13 so as to protect it against harmful overvoltage conditions. Thus in the event an excessively large voltage appears across resistor 42, the reverse-polarized Zener diode associated therewith (depending upon the instantaneous AC voltage polarity) breaks down so as to short-circuit current around resistor 42. The Zener breakdown voltage thereby establishes a limit on the maximum voltage, of either polarity, that may be applied through switch 38 to resistive network 41 and hence to liquid crystal display 13. In this fashion, each segment of liquid crystal display 13 is protected against the harmful effects of excessively high voltage being applied thereto.

The foregoing describes a simple, low cost, volt/ampere meter for use with alternating current. The meter provides a digital readout without requiring a separate power supply, and may be fabricated in a plug-in type embodiment which is safe and easy to operate.

While only certain preferred features of the invention have been shown by way of illustration, many modifications and changes will occur to those skilled in the art. For example, a converter may be employed to convert the instrument from a conventional residential outlet format to the three-pin 240 volt range outlet format, in which case the additional conductor could have associated with it an additional current transformer and limiting resistors for selecting current and voltage ranges for power supplied through the additional conductor. The device is also usable, if desired, with a converter attachment that allows use of extension leads on prongs 11 of the instrument such that alligator clips can be used to measure voltages in fuse boxes, motors, and other places where the two-prong plug-type format is not applicable. Additionally, a current extender loop can be employed with the instrument to allow measurement of current in a wire. The latter configuration requires that the current-carrying wire be broken and the broken ends be attached, with suitably designed clip leads, to a single prong and a socket receptacle electrically connected thereto. Further, if the device shown in FIG. 1 should include a passageway extending entirely through the device and through the center of core 32, any wire can be passed through the device for monitoring the current in the wire. It is, therefore, to be understood that the appended claims are intended to cover all such modifications and changes as fall within the true spirit of the invention.

We claim:

1. A volt/ampere meter comprising:
   a flux coupling means;
   a plurality of conductors for carrying alternating current to an electrical appliance, one of said conductors establishing a conduction path through said flux coupling means so as to form a primary winding for said flux coupling means;
   a secondary winding wound on said flux coupling means and having one end thereof coupled to a second one of said plurality of conductors;
   a first plurality of prongs coupled, respectively, to one end of each one of said plurality of conductors, respectively, and adapted to be inserted into a power receptacle;
   a socket adapted to receive a second plurality of prongs, each of said plurality of conductors, respectively, electrically coupling each prong of said first plurality, respectively, to each prong of said second plurality, respectively;
   liquid crystal display means comprising a plurality of display segments;
   switching means adapted to be selectively coupled either to the other end of said secondary winding or to said one of said conductors;
   a voltage divider network coupled between said switching means and said second one of said plurality of conductors; and
   passive circuit means coupling a separate tap, respectively, on said voltage divider network to a separate segment, respectively, of said liquid crystal display means such that selected segments of said liquid crystal display means are energized in accordance with voltage amplitude on said switching means.

2. The volt/ampere meter of claim 1 including a plurality of resistors coupled to said secondary winding means, said switching means being coupled to a selected one of said plurality of resistors in order to achieve a current measurement.

3. The volt/ampere meter of claim 1 including a plurality of resistors coupled to said one of said conductors, said switching means being coupled to a selected one of said plurality of resistors in order to achieve a voltage measurement.

4. The volt/ampere meter of claim 1 including a first plurality of resistors coupled to said secondary winding means and a second plurality of resistors coupled to said one of said conductors, whereby said switching means is coupled to a selected one of said first plurality of resistors in order to measure current in said one conductor or to a selected one of said second plurality of resistors in order to measure voltage across a pair of said conductors.

5. The volt/ampere meter of claim 4 including a moveable display mechanically coupled to said switching means.

6. The volt/ampere meter of claim 1 wherein said voltage divider network comprises a resistive network.

7. The volt/ampere meter of claim 6 wherein said display segments comprise bargraph elements.

8. The volt/ampere meter of claim 6 including voltage limiting means coupled in parallel with said voltage divider network.

9. The volt/ampere meter of claim 8 wherein said voltage limiting means comprises a pair of series-opposed Zener diodes.

10. The volt/ampere meter of claim 7 including voltage limiting means coupled in parallel with said voltage divider network.

11. The volt/ampere meter of claim 10 wherein said voltage limiting means comprises a pair of series-opposed Zener diodes.

12. The volt/ampere meter of claim 1 wherein said flux coupling means comprises an annular magnetic core and wherein said one of said conductors establishes said conduction path through said flux coupling means by passing through the center of said core.

13. The volt/ampere meter of claim 12 including a plurality of resistors coupled to said secondary winding means, said switching means being coupled to a selected one of said plurality of resistors in order to achieve a current measurement.

14. The volt/ampere meter of claim 12 including a plurality of resistors coupled to said one of said conductors, said switching means being coupled to a selected one of said plurality of resistors in order to achieve a voltage measurement.

15. The volt/ampere meter of claim 12 including a first plurality of resistors coupled to said secondary winding means and a second plurality of resistors coupled to said one of said conductors, whereby said switching means is coupled to a selected one of said first plurality of resistors in order to measure current in said one conductor or to a selected one of said second plurality of resistors in order to measure voltage across a pair of said conductors.

16. The volt/ampere meter of claim 15 including a moveable display mechanically coupled to said switching means.

17. The volt/ampere meter of claim 12 wherein said circuit means comprises a voltage divider network coupled to said switching means, and means coupling a separate tap, respectively, on said voltage divider network to a separate segment, respectively, of said liquid crystal display means.

18. The volt/ampere meter of claim 17 wherein said voltage divider network comprises a resistive network.

19. The volt/ampere meter of claim 18 wherein said display segments comprise bargraph elements.

20. The volt/ampere meter of claim 18 including voltage limiting means coupled in parallel with said voltage divider network.

21. The volt/ampere meter of claim 20 wherein said voltage limiting means comprises a pair of series-opposed Zener diodes.

22. The volt/ampere meter of claim 19 including voltage limiting means coupled in parallel with said voltage divider network.

23. The volt/ampere meter of claim 22 wherein said voltage limiting means comprises a pair of series-opposed Zener diodes.

* * * * *